US006242309B1

(12) United States Patent
Lee

(10) Patent No.: US 6,242,309 B1
(45) Date of Patent: Jun. 5, 2001

(54) METHOD OF FORMING A SPLIT GATE FLASH MEMORY CELL

(75) Inventor: Chien-Hsing Lee, Chu-Pei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/584,696

(22) Filed: Jun. 1, 2000

(51) Int. Cl.[7] ..... H01L 21/8247

(52) U.S. Cl. ..... 438/266; 438/595

(58) Field of Search ..... 438/257, 258, 438/264, 266, 267, 593, 594, 595

(56) References Cited

U.S. PATENT DOCUMENTS 5,856,224 * 1/1999 Sheu ..... 438/266
6,013,552 * 1/2000 Oyama ..... 438/266
6,143,606 * 11/2000 Wang et al. ..... 438/266

* cited by examiner

*Primary Examiner*—Chandra Chaudhari
(74) *Attorney, Agent, or Firm*—Winston Hsu

(57) ABSTRACT

A semiconductor wafer includes a silicon substrate, at least two floating gates positioned on the silicon substrate and a silicon nitride layer positioned on the surface of each floating gate. The method first uses a lithographic process and an ion implantation process to form a drain in the silicon substrate between the two floating gates. A passivation layer is then formed uniformly on the surface of the silicon substrate and the top surface and the sides of the floating gate. An etching process is performed later to form a spacer around each floating gate, the spacers between the floating gate are joined and cover the drain. Finally, an ion implantation process is performed, using the spacers as a hard mask, to form a source in the silicon substrate.

14 Claims, 6 Drawing Sheets 80 40 78 68 68 76 74 66 74 74 66 74 64 62 42

METHOD OF FORMING A SPLIT GATE FLASH MEMORY CELL

BACKGROUND OF THE INVENTION

1. Field of the Invention

The present invention relates to a method of forming a flash memory cell on a semiconductor wafer, and more particularly, to a method of forming a split gate flash memory cell of a non-volatile memory on a semiconductor wafer.

2. Description of the Prior Art

Non-volatile memory, such as an erasable and programmable read only memory (EPROM), electrically erasable programmable read only memory ($E^2$PROM) and flash memory, all store data regardless of whether or not electrical power is supplied, and read and write data by controlling a threshold voltage of a control gate. Conventionally, non-volatile memory is designed as a stack-gate. The stack-gate comprises a floating gate for storing charge, an ONO (oxide-nitride-oxide) dielectric layer and a control gate for reading and writing of the data. Like a capacitor storing data, the memory stores charge in the stack-gate to represent a “1”, and erases the charge from the stack-gate to represent a “0”. Additionally, the data stored in memory is changed by applying extra energy to the stack-gate.

Please refer to FIG. 1 to FIG. 4. FIG. 1 to FIG. 4 are cross-sectional diagrams of forming a split gate flash memory cell on a semiconductor wafer 10 according to the present invention. As shown in FIG. 1, the semiconductor wafer 10 comprises a silicon substrate 12 and a silicon oxide layer 14 positioned on the silicon substrate 12.

Please refer to FIG. 2. A patterned photoresist layer 16 is first formed on the surface of the silicon oxide layer 14. An ion implantation process is then performed, using the photoresist layer 16 as a hard mask, to form two doped regions on the surface of the silicon substrate 12. A rapid thermal process (RTP) is later used later to drive the dopants into the silicon substrate 12 to form two diffused regions 22. The diffused regions 22 serve as a source and a drain of a split gate, and the silicon substrate 12 between the two diffused regions serves as a channel of the split gate.

Please refer to FIG. 3. The photoresist layer 16 is removed and a low pressure chemical vapor deposition (LPCVD) process is performed to form a polysilicon layer (not shown). A patterned photoresist layer 26 is then formed on the surface of the polysilicon layer. An anisotropic etching process is performed, using the photoresist layer 26 as a hard mask, to vertically remove the polysilicon layer down to the surface of the silicon oxide layer 14 to form a floating gate 24 of the split gate flash memory cell.

Please refer to FIG. 4. The photoresist layer 26 is removed and an LPCVD process is performed to form a silicon oxide layer 28 uniformly on the surface of the semiconductor wafer 10. Another LPCVD process is then performed to form a polysilicon layer (not shown) on the surface of the silicon oxide layer 28 and a photoresist layer is formed on this polysilicon layer. An anisotropic process is then performed, using the photoresist layer as a hard mask, to vertically remove the polysilicon layer down to the surface of the silicon oxide layer 28 to form the control gate 30 of the split gate flash memory cell. The silicon oxide layer 28 serves as a tunnel oxide layer of the split gate flash memory cell.

The dimensions of the channel 20 (represented by “a” in FIG. 4) are determined by the dimensions of the floating gate 24 (represented by “c” in FIG. 4), the dimensions of the controlling gate 30 (represented by “b” in FIG. 4) and the overlapping regions of the controlling gate 30 with the floating gate 24. Because the dimensions of the channel 20 are simultaneously influenced by three factors, it is difficult to control the dimensions of the channel 20 during the formation of the split gate cell.

The positions of the source and the drain change during the fabrication of the split gate cell due to inaccuracies when aligning the photo mask. This results in the formation of a shorter channel of the split gate cell that usually causes punch through of the drain and the source, reducing the electrical performance of the split gate memory cell.

SUMMARY OF THE INVENTION

It is therefore a primary objective of the present invention to provide a method of forming a split gate memory cell with a self-aligned source and drain on a semiconductor wafer that solves the above-mentioned problems.

In a preferred embodiment, the present invention provides a method of forming a split gate memory cell with a self-aligned source and drain on a semiconductor wafer. The semiconductor wafer comprises a silicon substrate, at least two floating gates on the surface of the silicon substrate, and a silicon nitride layer on each floating gate. The method of the present invention first forms a photoresist layer on the surface of the silicon substrate and a lithographic process is then performed to remove a portion of the photoresist layer between the floating gates. A first ion implantation process is performed, using the photoresist layer and the silicon nitride layer on the floating gate as hard masks, to form a drain in the silicon substrate between the floating gates. After the photoresist layer is removed, a passivation layer is formed on the surface of the silicon substrate. The passivation layer covers the silicon substrate and the top surface and the walls of the floating gate. An etching process is performed to form a spacer around each floating gate. The spacers between the floating gates are joined and cover the drain. Finally, a second ion implantation process is performed, using the spacers as a hard mask, to form a drain.

It is an advantage of the present invention that the positions of the source and the drain are self-aligned to the floating gate of the split gate. The present invention performs ion implantation processes, using the silicon nitride layer on each floating gate as a hard mask, to form the drain on the silicon substrate, and uses the spacers around the floating gate as a hard mask, to perform another ion implantation process to form the source. Thus, the source and the drain are self-aligned to the floating gate and the dimensions of the channel of the split gate are accurately controlled. Since this effectively prevents changes of the channel length due to inaccuracies when aligning the photo mask, punch through issues of the drain and the source are thus avoided, ensuring the electrical performance of the split gate memory cell. Additionally, the present invention forms the source and the drain using two ion implantation processes. Hence, the dosage of the source and the drain can be flexibly changed according to manufacturing conditions.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
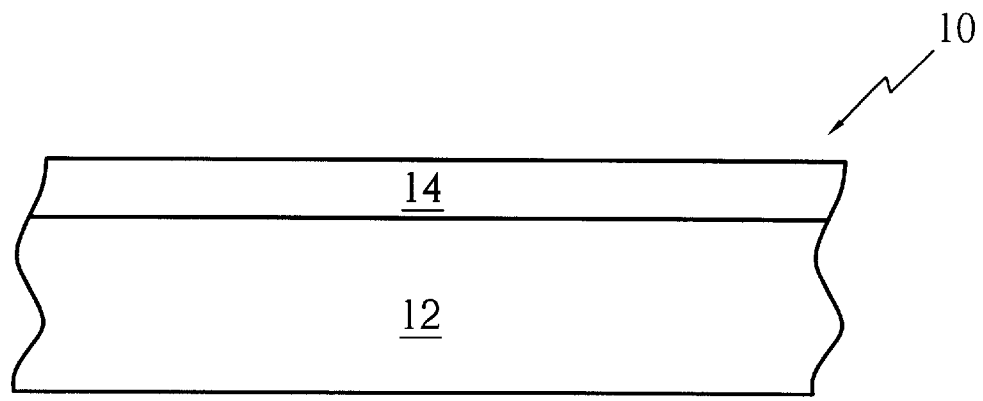
FIG. 1 to FIG. 3 are cross-sectional diagrams of forming a split gate cell on a semiconductor wafer according to the prior art.
Figure 2:
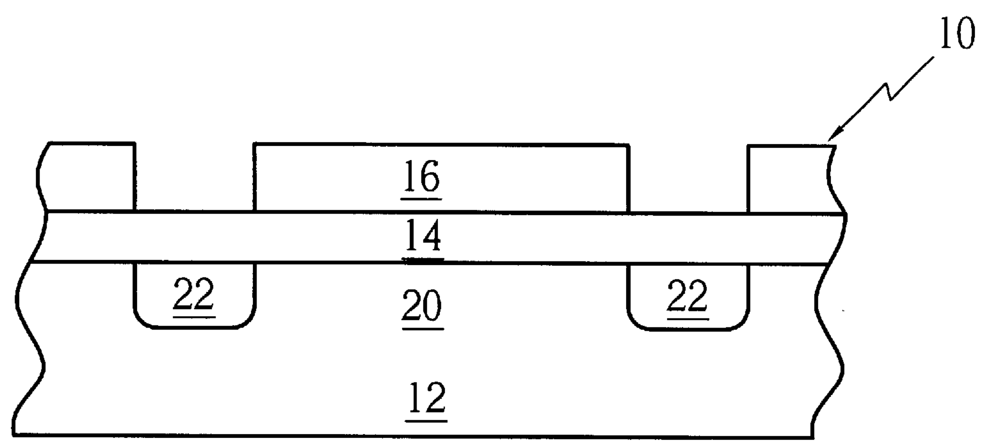
Figure 3:
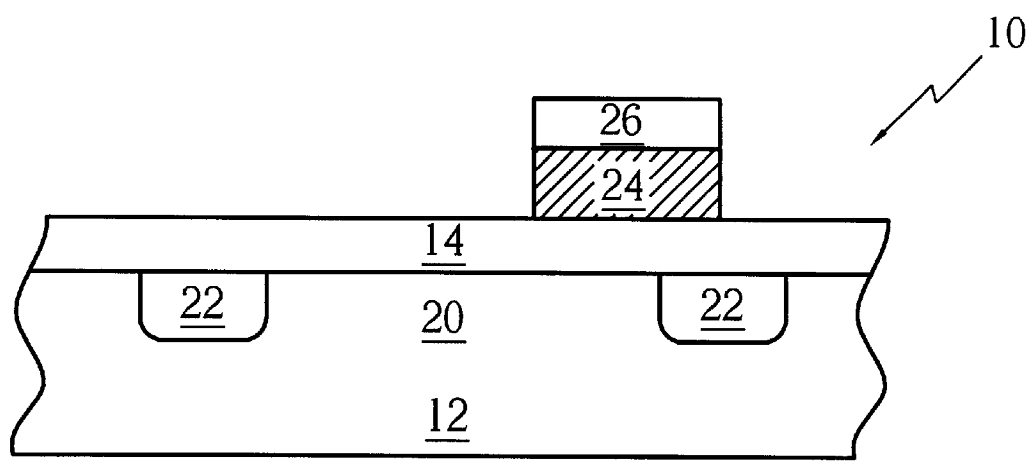
Figure 4:
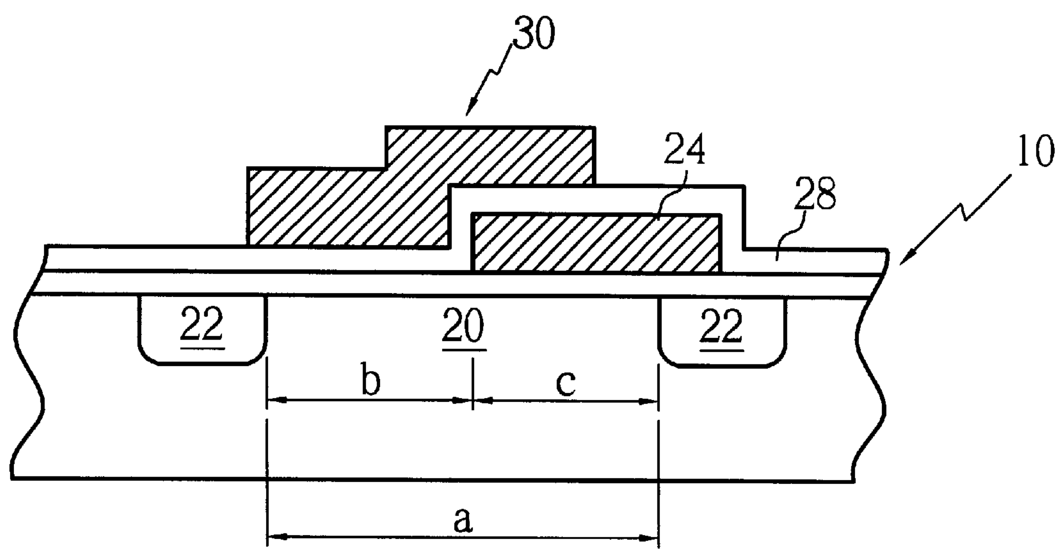
Figure 5:
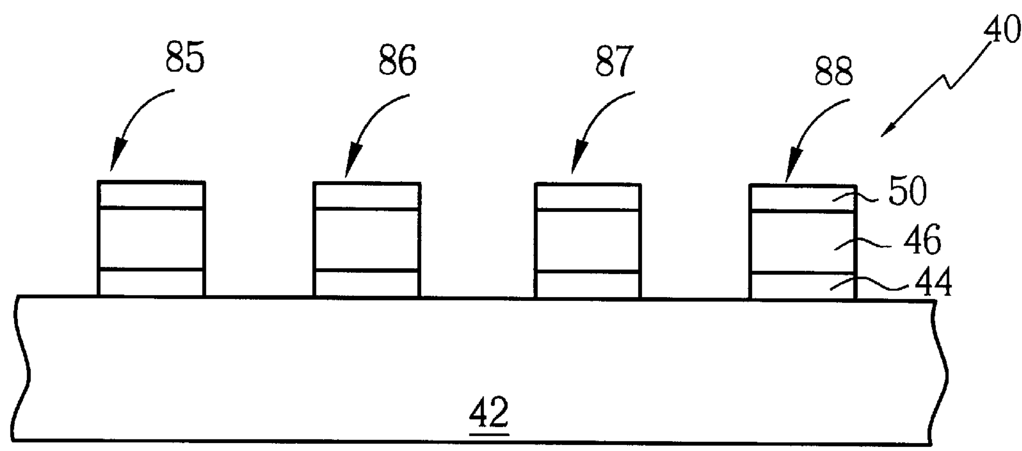
FIG. 5 to FIG. 11 are cross-sectional diagrams of forming a split gate cell on a semiconductor wafer according to the present invention.

Please refer to FIG. 5 to FIG. 11. FIG. 5 to FIG. 11 are cross-sectional diagrams of forming a split gate cell on a semiconductor wafer 40 according to the present invention. As shown in FIG. 5, the semiconductor wafer 40 comprises a silicon substrate 42, four floating gates 85, 86, 87, 88 positioned on the surface of the silicon substrate 42 and a silicon nitride layer 50 on the surface of each floating gate 85,86,87,88. Each floating gate 85,86,87,88 comprises a gate oxide layer 44 position on a predetermined area of the silicon substrate 42 and a polysilicon layer 46 positioned on the gate oxide layer 44.

Figure 6:
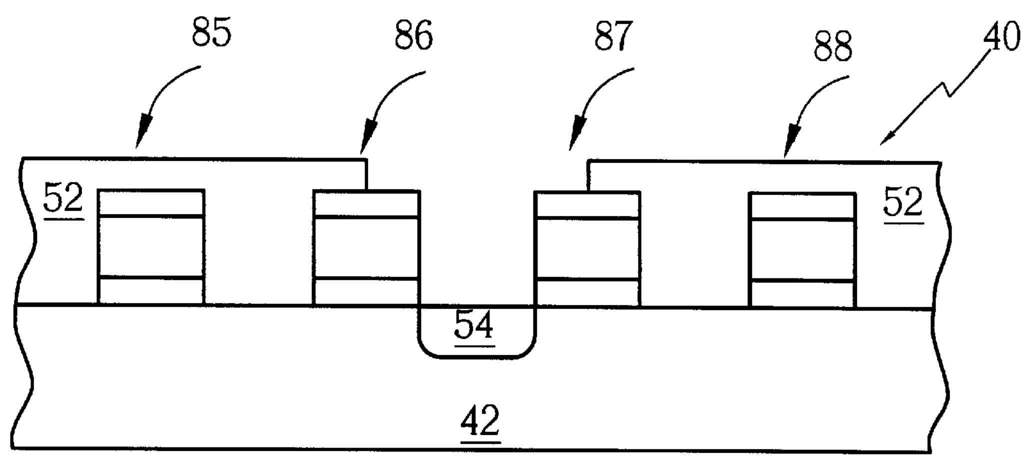

Please refer to FIG. 6. According to the present invention, a photoresist layer 52 is first formed on the surface of the semiconductor wafer 40 and a lithographic process is performed to remove the photoresist layer 52 between the floating gate 86 and 87. An ion implantation process is then performed, using the photoresist layer 52 and the silicon nitride layer 50 as a hard mask, to form a doped region on the surface of the silicon substrate 42. A rapid thermal process (RTP) is performed to drive the dopants of the doped region into the silicon substrate 42 to form a drain 54. Dopants with a dosage in a range between $1\times10^{14}$ (ions/cm$^2$) and $1\times10^{15}$ (ions/cm$^2$) are used in the ion implantation process.

Figure 7:
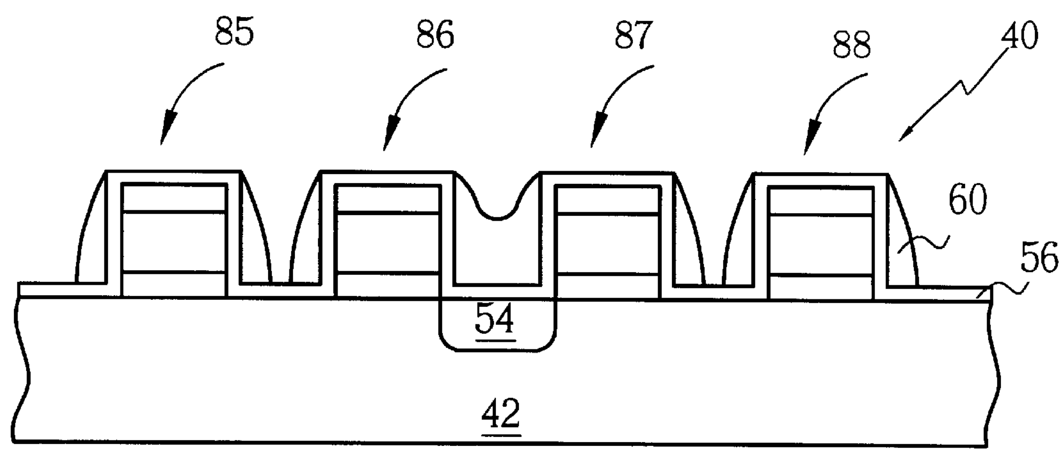

Please refer to FIG. 7. A uniform passivation layer 56 is formed of silicon nitride or silicon oxide on the surface of the semiconductor wafer 40 after the photoresist layer is totally removed. The passivation layer 56 totally covers the silicon substrate 42 and the top surface and the sides of the floating gate 85,86,87,88. A sacrificial layer (not shown) is uniformly formed on the surface of the passivation layer 56 and an etch back process is performed to remove a portion of the sacrificial layer from the surface of the passivation layer 56. The remaining portions of the sacrificial layer forms a spacer 60 around each floating gate 85,86,87,88. The spacers 60 between the floating gates 86 and 87 are joined and cover the drain 54. In order to have good etching selectivity, if the passivation layer 56 is formed of silicon nitride, the sacrificial layer is formed of silicon oxide; if the passivation layer 56 is formed of silicon oxide, the sacrificial layer is formed of silicon nitride.

Figure 8:
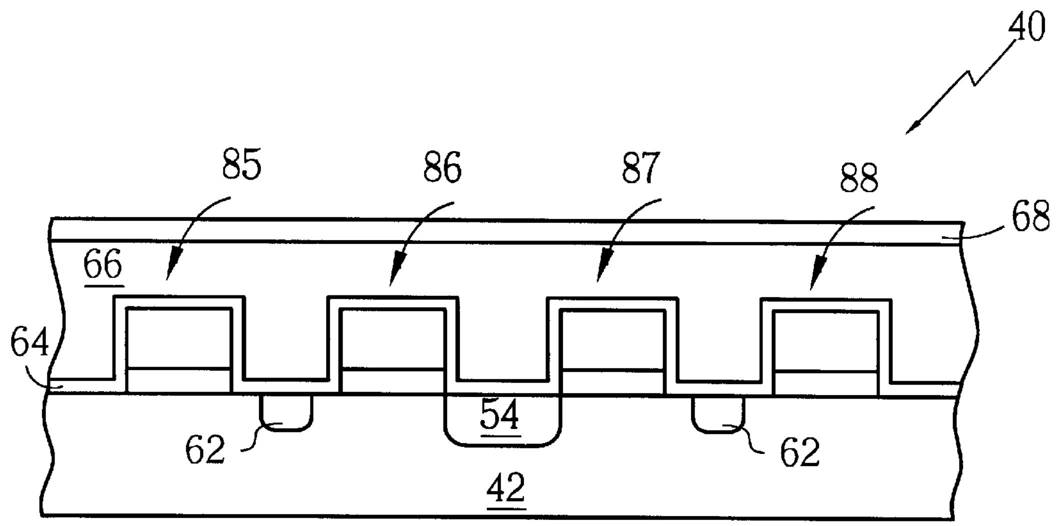

Please refer to FIG. 8. An ion implantation process is performed, the spacers 60 serving as a hard mask, to form two doped regions (not shown) on the surface of the silicon substrate 42 between the floating gates 85,86 and between the floating gate 87,88. A rapid thermal process (RTP) is performed to drive the dopants of the two doped regions into the silicon substrate 42 to form two sources 62 in the silicon substrate 42. Dopants with a dosage about $1\times10^{14}$ (ions/cm$^2$) are used in the ion implantation process. The spacers 60, the passivation layer 56 and the silicon nitride layer 50 are removed. An LPCVD process is then performed to form a silicon oxide layer 64 uniformly on the surface of the semiconductor wafer 40. The silicon oxide layer 64 serves as a tunneling oxide layer of the split gate cell and covers the surface of the silicon substrate 42 and the top surfaces and the sides of the floating gates 85,86,87,88. A polysilicon layer 66 is formed on the surface of the silicon oxide layer 64 and a silicon nitride layer 68 is then formed on the surface of the polysilicon layer 66 by performing an LPCVD process.

Figure 9:
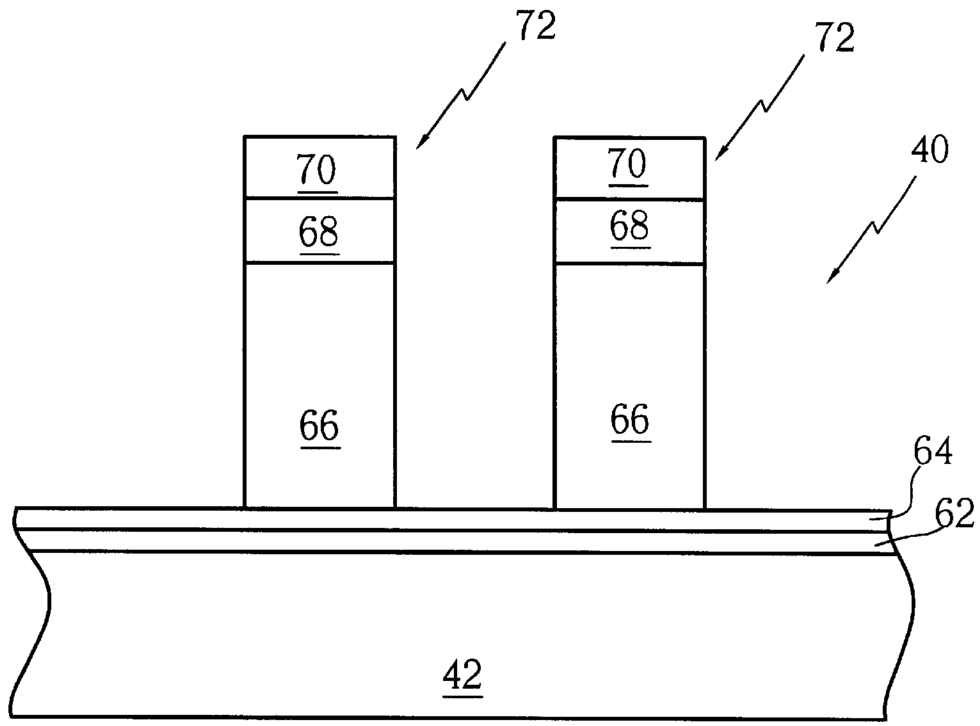
Figure 10:
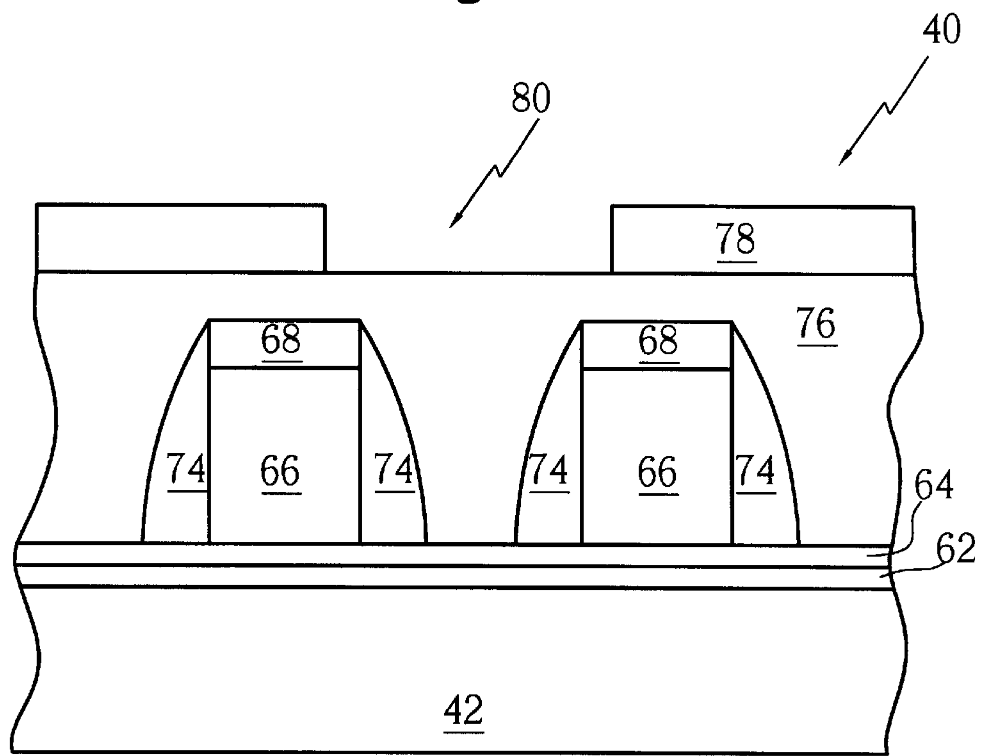
Figure 11:
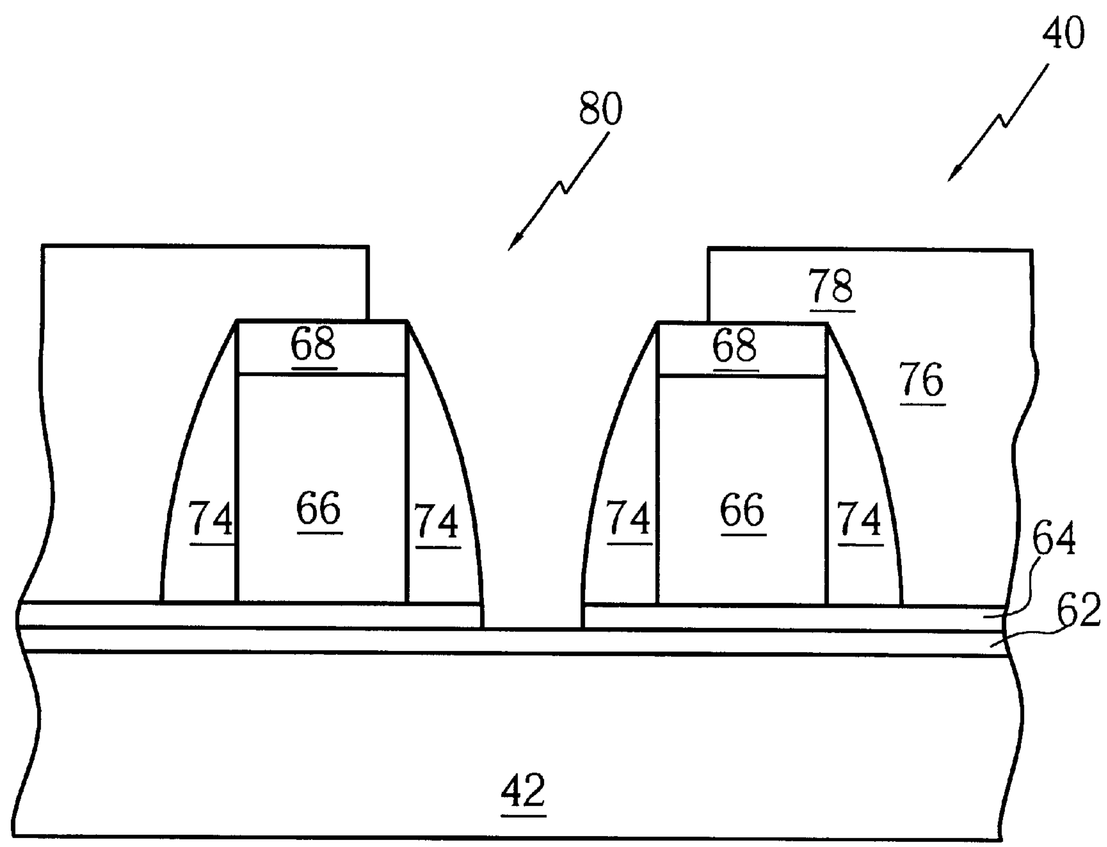

Please refer to FIG. 9 to FIG. 11. FIG. 9 to FIG. 11 are cross-sectional diagrams of the semiconductor wafer 40 with the cross-sectional line orthogonal to the cross-sectional line of FIG. 8. As shown in FIG. 9, a photoresist layer 70 is formed on the surface of the silicon nitride layer 68 and a lithographic process is performed to form a pattern of a control gate in the photoresist layer 70. An etching process is then performed, using the photoresist layer 70 as a hard mask, to vertically remove both the silicon nitride layer 68 and the polysilicon layer from the silicon oxide layer 64 to form the control gate 72 of the split gate cell. The photoresist layer 70 is then totally removed after the control gate 72 is completed.

Please refer to FIG. 10. An LPCVD process is performed to form a silicon nitride layer (not shown) after the photoresist layer 70 is totally removed. An etch back process is then performed to vertically remove a portion of the silicon nitride layer from the silicon oxide layer 64. The remaining portions of the silicon nitride layer form a spacer 74 around the control gate 72. A dielectric layer 76 is formed of silicon oxide on the surface of the semiconductor wafer 40 and a photoresist layer 78 is then formed on the surface of the dielectric layer 70. A lithographic process is performed later to form an opening 80 in the photoresist layer 78 to pattern a contact hole 82.

Please refer to FIG. 11. An etching process is performed to vertically remove the dielectric layer 76 under the opening down to the surface of the silicon substrate 42 to form the contact hole 82. An ion implantation process is then performed on the surface of the silicon substrate 42 in the contact hole 82 to reduce the contact resistance between the source 62 and a subsequently formed contact plug in the contact hole 82. Finally, the photoresist layer 78 is totally removed to complete the fabrication process.

The present invention performs ion implantation processes, using the silicon nitride layer 50 on the floating gates 85,86,87,88 as a hard mask, to form the drain 54 on the silicon substrate, and using the spacers 60 around the floating gates 85,86,87,88 as a hard mask to perform another ion implantation process to form the source 62. Thus, the source 62 and the drain 54 are self-aligned to the floating gate 85,86,87,88, and the dimensions of the channel of the split gate are accurately controlled. Since this effectively prevents any change of the channel length due to photo mask alignment inaccuracies, punch through issues of the drain 54 and the source 62 are avoided, ensuring the electrical performance of the split gate memory cell. Additionally, the present invention forms the source 62 and the drain 54 through two ion implantation processes. The dosage of the source 62 and the drain 54 can thus be changed flexibly according to manufacturing conditions.

Compared to the prior art method, the present invention provides a method of forming a split gate flash memory cell with a self-aligned source and drain. The present invention controls the channel length of the split gate flash memory cell accurately, and punch through issues of the drain and source are avoided, ensuring the electrical performance of the split gate memory cell. Additionally, the present invention forms the source 62 and the drain 54 through two ion implantation processes. The dosage of the source 62 and the drain 54 can thus be changed according to manufacturing requirements.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a split gate flash memory cell with a self-aligned source and drain on a semiconductor wafer, the semiconductor wafer comprising:

a substrate;

at least two floating gates positioned on the substrate; and a silicon nitride layer positioned on each floating gate; the method comprising:

forming a photoresist layer on the surface of the semiconductor wafer;

performing a lithographic process to remove the photoresist layer between the floating gates;

performing a first ion implantation process to form a drain in the substrate between the floating gates, the photoresist layer and the silicon nitride layer serving as hard masks;

removing the photoresist layer;

forming a uniform passivation layer on the surface of the semiconductor wafer, the passivation layer covering the top surface and the sides of the floating gates;

forming a spacer around each floating gate, the spacers between the floating gates being joined and covering the drain;

performing a second ion implantation process to form a source in the substrate, the spacer serving as hard mask.

2. The method of claim 1 wherein the passivation layer is formed of silicon oxide or silicon nitride.

3. The method of claim 2 wherein the method of forming the spacer comprises the following steps:

forming a sacrificial layer uniformly on the surface of the passivation layer; and performing an etch back process to remove the sacrificial layer from the surface of the passivation layer, the remaining portions of the sacrificial layer forming the spacer around the floating gate;

wherein if the passivation layer is formed of silicon nitride, the sacrificial layer is formed of silicon oxide; if the passivation layer is formed of silicon oxide, the sacrificial layer is formed of silicon nitride.

4. The method of claim 1 wherein the dosage of the first ion implantation process is between $10^{14}$ and $10^{15}$ (ion/cm$^2$).

5. The method of claim 1 wherein the dosage of the second ion implantation process is about $10^{14}$ (ion/cm$^2$).

6. A method of forming a split gate flash memory cell on a semiconductor wafer, the semiconductor wafer comprising:

a substrate;

at least two floating gates positioned on the substrate; and a silicon nitride layer positioned on each floating gate;

the method comprising:

forming a photoresist layer on the surface of the semiconductor wafer;

performing a lithographic process to remove the photoresist layer between the floating gates;

performing a first ion implantation process to form a drain in the substrate between the floating gates, the photoresist layer and the silicon nitride layer serving as hard masks;

removing the photoresist layer;

forming a passivation layer uniformly on the surface of the semiconductor wafer, the passivation layer covering the top surface and the sides of the floating gates;

forming a spacer around each floating gate, the spacers between the floating gates being joined and covering the drain;

performing a second ion implantation process to form a source in the substrate, the spacer serving as a hard mask;

removing the spacer;

forming a control gate above the floating gate; and performing a self-aligned etching process to form a contact hole, a contact plug being subsequently formed in the contact hole to electrically connect the split gate flash memory cell with other components on the semiconductor wafer.

7. The method of claim 6 wherein the passivation layer is formed of silicon oxide, or silicon nitride.

8. The method of claim 7 wherein the method of forming the spacer comprises the following steps:

forming a sacrificial layer uniformly on the surface of the passivation layer; and performing an etch back process to remove the sacrificial layer from the surface of the passivation layer, the remaining portions of the sacrificial layer forming the spacer around the floating gate;

wherein if the passivation layer is formed of silicon nitride, the sacrificial layer is formed of silicon oxide; if the passivation layer is formed of silicon oxide, the sacrificial layer is formed of silicon nitride.

9. The method of claim 6 wherein the dosage of the first ion implantation process is between $10^{14}$ and $10^{15}$ (ion/cm$^2$).

10. The method of claim 6 wherein the dosage of the second ion implantation process is about $10^{14}$ (ion/cm$^2$).

11. The method of claim 6 wherein the method of forming the control gate comprises the following steps:

forming a gate oxide layer that uniformly covers the surface of the semiconductor wafer;

forming a polysilicon layer on the surface of the gate oxide layer;

forming a silicon nitride layer on the surface of the polysilicon layer;

forming a photoresist layer on the surface of the silicon nitride layer;

performing a lithographic process to form a pattern of the control gate in the photoresist layer;

performing an etching process to vertically remove both the silicon nitride layer and the polysilicon layer under the pattern to form the control gate; and removing the photoresist layer.

12. The method of claim 6 wherein the self-aligned etching process comprises the following steps:

forming a spacer around the control gate;

forming a dielectric layer on the surface of the semiconductor wafer;

forming a photoresist layer on the surface of the dielectric layer;

performing a lithographic process to form an opening in the photoresist layer to pattern the contact hole;

performing an etching process to vertically remove the dielectric layer under the pattern down to the surface of the substrate to form the contact hole; and removing the photoresist layer.

13. The method of claim 12 wherein the spacer around the control gate is formed of silicon nitride and the dielectric layer is formed of silicon oxide.

14. The method of claim 6 wherein an ion implantation process is performed on the surface of the substrate in the contact hole to reduce the contact resistance between the source and a subsequently formed contact plug in the contact hole.

* * * * *